United States Patent
Furnival

[19]

[11] Patent Number: 6,081,039
[45] Date of Patent: *Jun. 27, 2000

[54] PRESSURE ASSEMBLED MOTOR CUBE

[75] Inventor: Courtney Furnival, Temecula, Calif.

[73] Assignee: International Rectifier Corporation, El Segundo, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/985,508

[22] Filed: Dec. 5, 1997

Related U.S. Application Data

[60] Provisional application No. 60/032,621, Dec. 6, 1996.

[51] Int. Cl.$^7$ .................................................. H01L 23/52
[52] U.S. Cl. .......................... 257/785; 257/688; 257/689; 257/687; 257/706; 257/724; 257/725; 257/726; 257/727; 257/698; 257/177; 257/178; 257/181; 257/182; 361/707; 361/728; 361/820
[58] Field of Search ................................ 257/688–689, 257/687, 706, 723–727, 698–699, 785, 177, 178, 181, 182; 361/728, 735, 820, 717

[56] References Cited

U.S. PATENT DOCUMENTS

| | | | |
|---|---|---|---|
| 2,780,758 | 2/1957 | Zetwo | 257/785 X |
| 2,936,409 | 5/1960 | Jackson et al. | 257/688 X |
| 3,452,254 | 6/1969 | Boyer | 257/689 |
| 3,506,889 | 4/1970 | Vogt | 257/785 |
| 3,525,910 | 8/1970 | Philips | 257/785 |
| 4,443,655 | 4/1984 | Van Dyk Soerewyn | 257/687 X |
| 5,489,802 | 2/1996 | Sakamoto et al. | 257/688 |
| 5,677,567 | 10/1997 | Ma et al. | 257/666 |
| 5,739,556 | 4/1998 | Bolgiani | 257/182 |

FOREIGN PATENT DOCUMENTS

| | | | |
|---|---|---|---|
| 1299074 | 7/1969 | Germany | 257/689 |
| 159233 | 1/1979 | Netherlands | 257/785 |

*Primary Examiner*—John Guay
*Attorney, Agent, or Firm*—Ostrolenk, Faber, Gerb & Soffen, LLP

[57] ABSTRACT

A pressure assembled power module is provided with first and second die, the first and second die being stacked atop one another and sandwiched between first and second conductive sheets, where the die are separated by a relatively flat central conductive lead. Integral to the central conductive lead are spring elements which bias the die against both the conductive sheets and the central conductive lead. Consequently, electrical and thermal interconnections are achieved between semiconductor devices and between the semiconductor devices and a heat sink or substrate.

23 Claims, 3 Drawing Sheets

PRESSURE ASSEMBLED MOTOR CUBE

CROSS-REFERENCE TO RELATED APPLICATION

This application is based on and claims priority to U.S. Provisional Patent Application No. 60/032,621, filed on Dec. 6, 1996, entitled PRESSURE ASSEMBLED MOTOR CUBE.

BACKGROUND OF THE INVENTION

The present invention relates to power module design and, more particularly, to a pressure assembled power module capable of driving a motor controller or the like.

Conventional power module designs require that interconnections be made between a plurality of semiconductor devices mounted within the module. Due to the high currents encountered in such devices, the interconnections are typically made using relatively wide interconnect tracks, for example, patternable conductive runs on an insulated metal substrate (IMS). Other methods of interconnection include heavy weight wire bonds or the like.

Conventional power module designs which interconnect semiconductor devices using interconnect tracks or wire bonds are disadvantageous in that they require the semiconductor devices to be spaced apart and disposed in a generally coplanar orientation such that interconnections may be readily made. Consequently, such power modules are relatively large.

Conventional power module designs also are disadvantageous in that (1) they require that the semiconductor devices be mounted to a substrate by way of solder, ultrasonic bonding, or the like and (2) they require that the interconnect tracks or wire bonds be soldered or ultrasonically bonded to the semiconductor devices themselves. Consequently, stresses develop at the device-substrate and device-interconnect interfaces due to thermal mismatches therebetween.

Still further, the use of interconnect tracks or wire bonds for making interconnections between semiconductor devices within a power module introduces parasitic resistances and inductances into the circuit which increase heat dissipation and degrade electrical performance of the circuit (for example, reducing switching speeds).

SUMMARY OF THE INVENTION

In order to overcome the disadvantages of conventional power module designs, the present invention employs a compression technique for mounting and interconnecting the semiconductor die within the power module (i.e., a pressure assembled power module).

More specifically, first and second die are stacked atop one another and are sandwiched between first and second conductive sheets where the die are separated by a least one relatively flat central conductive lead. Integral to the central conductive lead are spring elements which bias the die against both the conductive sheets and the central conductive lead. Consequently, electrical and thermal interconnections are achieved between semiconductor devices and between the semiconductor devices and a heat sink or substrate.

Advantageously, size reductions are achieved because the semiconductor devices are stacked one atop the other rather than being spaced apart and relatively coplanar in orientation. Further, thermal stresses are virtually eliminated because the die are permitted to shift relative to adjacent structures. Still further, parasitic resistance and inductances are significantly reduced since interconnections are made by direct contact with package leads. Also, undesirable radiation and/or reception of electromagnetic interference (EMI) is significantly reduced because the semiconductor devices are sandwiched between conductive sheets which act as an integral EMI shield.

Still further, the use of compression techniques in the mounting and interconnection of the semiconductor die permits the use of unconventional thermally conductive materials in the module which would heretofore be prohibitive due to expense or due to mismatches in thermal expansion between the die and the thermally conductive materials.

Finally, the simplified construction of the power module achieved by the compression technique of the present invention permits the use of larger die without special metalization for interconnections resulting in reduced fabrication costs, reduced rework costs and higher yields.

Other features and advantages of the present invention will become apparent from the following description of the invention which refers to the accompanying drawings.

BRIEF DESCRIPTION OF THE DRAWING

For the purpose of illustrating the invention, there is shown in the drawing a form which is presently preferred, it being understood, however, that the invention is not limited to the precise arrangement and instrumentality shown.

DETAILED DESCRIPTION OF THE INVENTION

Figure 5:
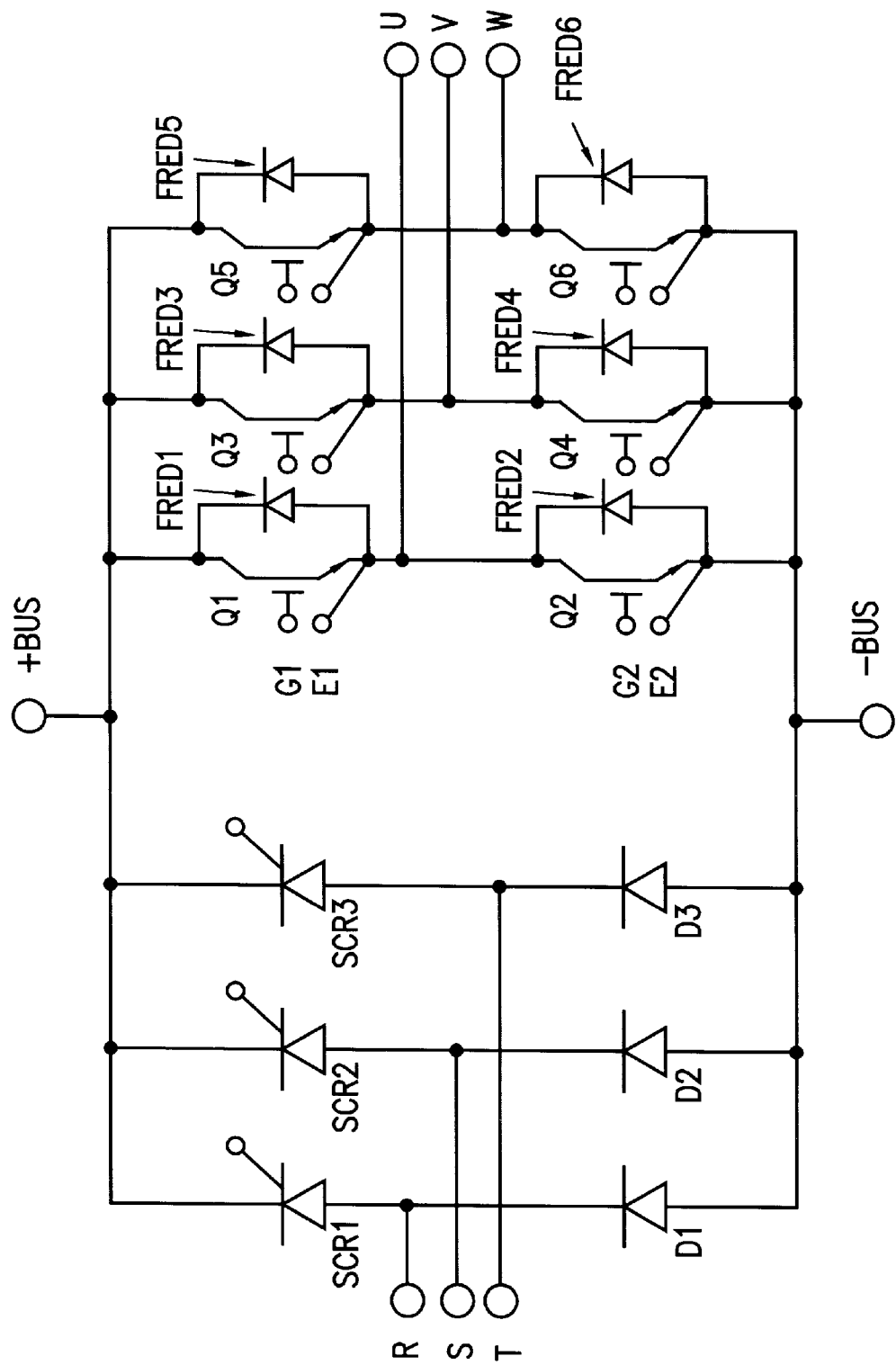
FIG. 5 shows an example of a circuit suited for fabrication in a pressure assembled power module in accordance with the present invention.

Referring now to the drawings wherein like numerals indicate like elements, there is shown in FIG. 5 a bridge circuit which is typically used to drive a three phase motor or the like from a three phase source. Such a circuit is particularly suited for fabrication in a pressure assembled power module in accordance with the preferred embodiment of the present invention because the circuit consists of a plurality of "legs" where each leg includes at least two power semiconductor devices in series connection. Further, the circuit is substantially symmetrical (i.e., each leg is substantially similar to the next) and many power semiconductor devices share common interconnection nodes.

It is noted that the instant invention contemplates coverage of pressure assembled power modules having differing circuit configurations than that shown in FIG. 5 and the specific circuit configuration shown in FIG. 5 is chosen only by way of example.

The circuit of FIG. 5 includes an input bridge circuit consisting of SCR1–SCR3 and D1–D3 and an output bridge circuit consisting of Q1–Q6 and FRED1–FRED6. The input bridge circuit is well known in the art to produce a rectified DC voltage across the +BUS and −BUS terminals in response to a three phase input voltage at the R, S and T terminals. The output bridge circuit is known in the art to produce a three phase AC source of power at terminals U, V and W which are connected to, for example, a motor (not shown).

The output bridge circuit is preferably formed of insulated-gate-bipolar-transistor (IGBT) and fast-recovery-diode (FRED) pairs. Each IGBT-FRED pair is connected in an anti-parallel configuration for use as a switch. As is known in the art, the IGBTs are biased on and off by way of appropriate bias voltages between respective gate (G) and emitter (E) terminals.

As will be discussed in detail below, the circuit is well suited for fabrication in a pressure assembled power module in accordance with the present invention because each leg of the input and output bridge, respectively, are formed of series connected power semiconductor devices sharing a common central node (i.e., terminals R, S, T, U, V and W) and because groups of semiconductor devices share common connections with the +BUS and −BUS respectively (i.e., SCR1-3, Q1, Q3, Q5, FRED1, FRED3 and FRED5 share connection to the +BUS and D1-3, Q2, Q4, Q6, FRED2, FRED4 and FRED6 share connection to the −BUS).

Figure 1:
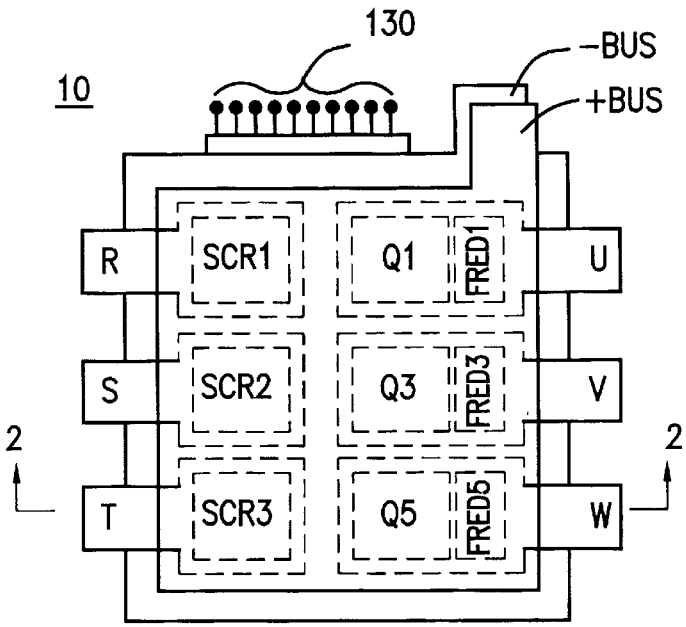
FIG. 1 shows a top plan view of a plurality of semiconductor devices arranged in a stacked configuration in accordance with the preferred embodiment of the present invention.
Figure 2:
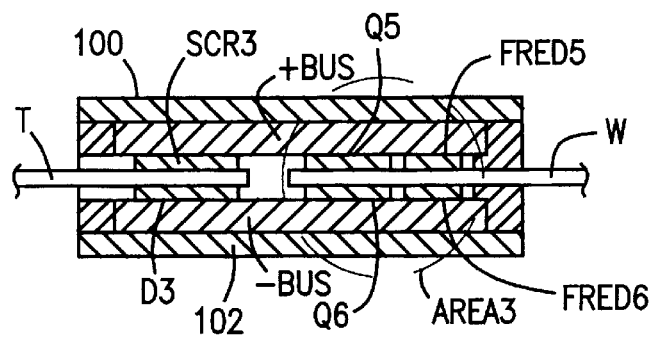
FIG. 2 is a cross sectional side view of the structure of FIG. 1 taken through section 2—2.

Referring now to FIGS. 1 and 2, a pressure assembled power module (PAPM) 10 is shown which is a realization of the bridge circuit of FIG. 5. As best seen in FIG. 2, the pairs of semiconductor devices are oriented in stacked relationships. For example, SCR3 is stacked atop D3, Q5 is stacked atop Q6 and FRED5 is stacked atop FRED6.

Leads (or terminals) T and W are disposed between respective stacked semiconductor devices to provide series connections therebetween and to provide interconnection from external circuitry to the PAPM 10. Thus, lead W provides the interconnection of the emitter of Q5, the anode of FRED5, the collector of Q6 and the cathode of FRED6 (see FIG. 5). Similarly, lead T provides the interconnection of the anode or SCR3 to the cathode of D3.

The pairs of stacked semiconductor devices are sandwiched between sheets of conductive material forming the +BUS and −BUS. Thus, the sheet of conductive material forming the +BUS provides the interconnection of the cathodes of SCR1–SCR3, FRED1, FRED3 and FRED5 and the collectors of Q1, Q3 and Q5 (see FIG. 5). Similarly, the sheet of conductive material forming the −BUS provides the interconnection of the anodes of D1–D3, FRED2, FRED4 and FRED6 and the emitters of Q2, Q4 and Q6.

Electrically insulating but thermally conductive material 100 is provided atop the +BUS and a similar material 102 is provided below the −BUS to properly isolate the voltage buses from the heat sink or substrate (not shown).

It is preferred that the overall height of the PAPM 10 (as shown in FIG. 2) be about 0.300 inches, that the width of the PAPM 10 (shown in FIG. 1) be about 2.600 inches and that the depth of the PAPM 10 (shown in FIG. 1) be about 2.900 inches.

Of particular importance to the present invention is that the leads R, S, T, U, V and W bias the respective semiconductor dies towards the +BUS and −BUS, respectively, such that, with the +BUS and −BUS fixed, the entire structure is compressed and maintains interconnection integrity.

Figure 3:
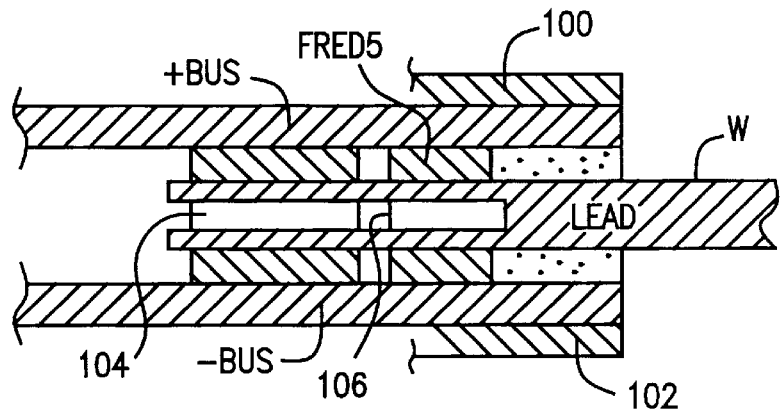
FIG. 3 is an enlarged view of the "area 3" of FIG. 2.

Reference is now made to FIG. 3 which shows an enlarged view of "area 3" of FIG. 2. As shown, the lead W (and all other leads not shown) are forked with resilient materials 104 and 106 disposed between the upper and lower members 120, 122 forming the fork. The resilient materials 104, 106 are springingly biased to force the upper and lower members 120, 122 apart which biases the semiconductor die toward the +BUS and −BUS respectively.

To ensure proper biasing, a suitable resilient element must be chosen. A spring metal such as a piece of metal with a dimple which is capable of resilient contact with the components of the motor cube would be suitable. A metal suitable for use with a dimple is beryllium copper. Other spring structures may also be used, but these spring structures must be able to withstand the relatively high currents encountered in motor controller applications.

The spring biased fork members 120, 122 provide independent loading for each stacked pair of semiconductor die which accommodates and adjusts for dimensional tolerances and thermal stresses due to mismatched thermal expansion coefficients of differing materials.

Unconventional electrically isolating but thermally conductive materials 100, 102 may be employed because the materials are press fit to adjacent structures and do not require specialized metalization or thermal expansion matching. For example, alumina, aluminum nitride, IMS, diamond and the like may be readily used for the insulation materials 100, 102. Specifically, DBC metalization is not required when using aluminum nitride as the insulation materials 100, 102 because neither soldering nor ultrasonic bonding (nor the like) is employed to interconnect the die, buses or insulating materials.

It is noted that the IGBTs, FREDs, SCRs and diodes (or other components if required) will require metalization and edge termination isolation. The metalization will provide electrical compression contacts and also provide some structural protection of the semiconductor die. It is preferred that the final metalization be gold flash.

Referring to FIG. 1, gate and emitter terminals (or control terminals) 130 are provided which may be implemented using, for example, wire bonds or other suitable interconnecting methods known in the art.

It is preferred that the PAPM 10 be potted with a non-rigid material such that relative movement is permitted between compressed structures. The potting material should preferably wet the structure to which it comes into contact but should not interfere with the compression contact between the die, the buses, the insulation materials, etc. Oil is the preferred potting material as such material provides high voltage isolation, low thermal coefficients of expansion and will not interfere with the compression contact between structures.

Figure 4:
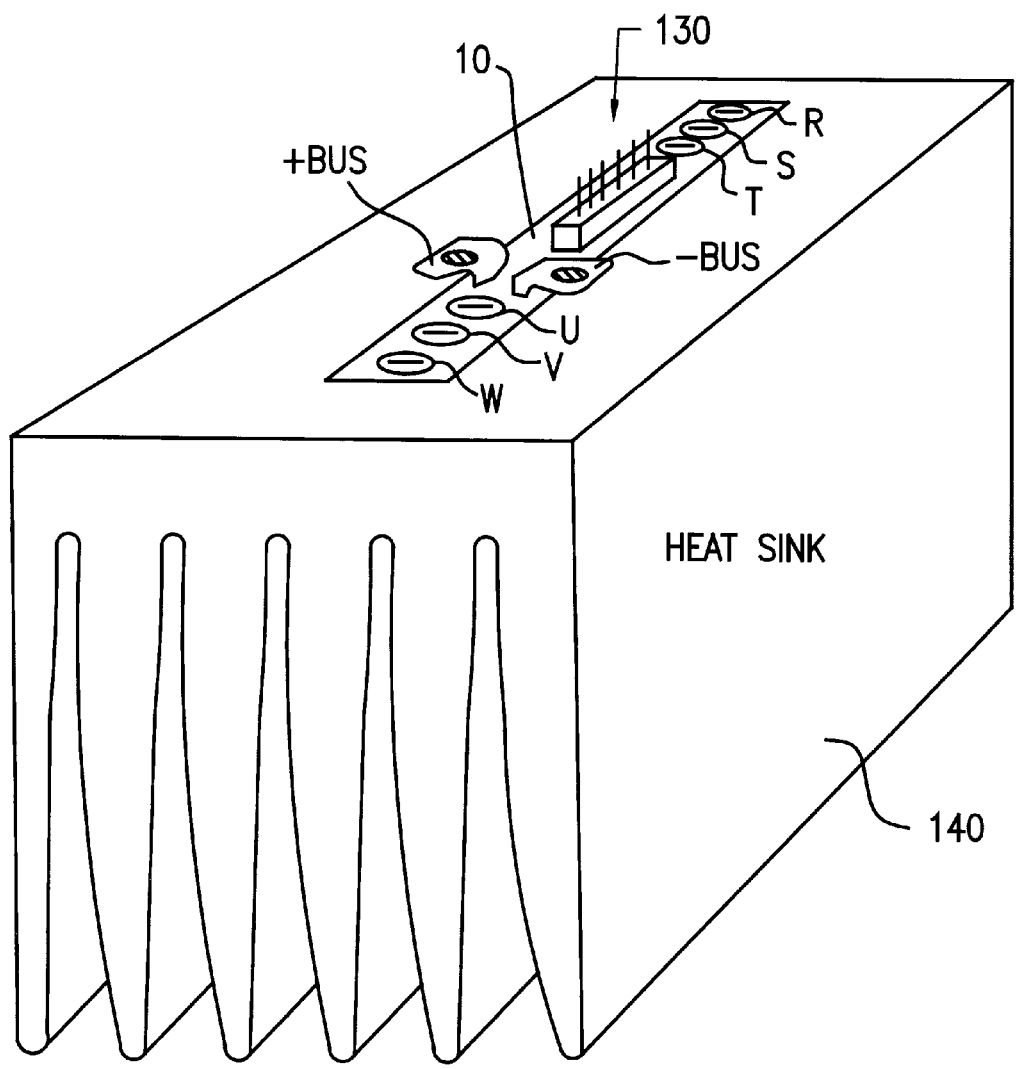
FIG. 4 shows a perspective view of the pressure assembled power module of the preferred embodiment of the present invention disposed within a heat sink.

Referring now to FIG. 4, the PAPM 10 is shown disposed within a cavity in a heat sink 140. The cavity is sized such that the PAPM 10 structure shown in FIGS. 1 and 2 can be readily pressed into the cavity and such that the walls of the cavity provide a stop against which the insolation material 100, 102 is pressed by way of the springingly biased structure within the PAPM 10. Thus, requisite thermal conductivity from the die to the heat sink 140 is achieved.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A pressure assembled semiconductor package comprising:

a first die having a metallized top surface and a metallized bottom surface;

a second die having a metallized bottom surface;

a first conductive lead, a bottom of the first conductive lead being in direct contact with the top metallized surface of first die and adapted to provide an electrical connection to the first die;

at least a second conductive lead in direct contact with the bottom metallized surface of first die and adapted to provide another electrical connection to the first die; and a spring element adapted to bias the first die and second die against their respective leads;

a third conductive lead, a top of the third conductive lead being in direct contact with the metallized bottom surface of the second die and adapted to provide an electrical connection to the second die;

an electrically insulating material located on top of the first conductive lead and on a bottom of the third conductive lead, the insulating material adapted to electrically isolate the first and third conductive leads; and a heat sink having walls that create a cavity such that the pressure assembled semiconductor package can be readily pressed into the cavity and that the walls of the cavity provide a stop against which the insulation material is pressed by the springing element.

2. The package of claim 1, wherein the spring element is contained within the at least second conductive lead.

3. The package of claim 1, further comprising a potting material to allow relative movement between the package and the heat sink.

4. The package of claim 1, wherein the first and second die are located in between the first and third conductive leads; and the at least second conductive lead is situated in between the first and second die.

5. The package of claim 4, wherein the at least second conductive lead provides an electrical connection between the first and second die.

6. The package of claim 5, wherein the first and second die form a power circuit.

7. The package of claim 6, wherein the power circuit comprises at least one pair of series coupled semiconductor circuits wherein the first die includes one of the semiconductor circuits and the second die includes another of the semiconductor circuits.

8. The package of claim 7, wherein the pair of semiconductor circuits includes an SCR and a diode.

9. The package of claim 7, wherein the pair of the semiconductor circuits includes two transistor circuits.

10. The package of claim 9, wherein each transistor circuit includes a mos-gated transistor.

11. The package of claim 9, wherein each transistor circuit includes a transistor and a diode coupled in an anti-parallel configuration.

12. The package of claim 11, wherein the transistor is an insulated gate bipolar transistor and the diode is a fast recovery diode.

13. The package of claim 7, wherein the pair of semiconductor circuits include an input bridge circuit.

14. The package of claim 7, wherein the pair of semiconductor circuits include an output bridge circuit.

15. The package of claim 11, wherein each of the transistors and each of the diodes are formed from separate die.

16. The package of claim 8, wherein the at least second conductive lead electrically connects the SCR with the diode.

17. The package of claim 9, wherein the at least second conductive lead electrically connects the transistor circuits.

18. The package of claim 8, wherein the pair of semiconductor circuits also include two transistor circuits.

19. The package of claim 18, wherein the SCR, the diode and the transistor circuits are formed from separate die.

20. The package of claim 19, wherein the first and third conductive leads electrically connect the SCR to one of the transistor circuits and the diode to the other transistor circuit.

21. The package of claim 2, wherein the spring element is a spring metal.

22. The package of claim 21, wherein the at least second conductive lead includes two forked portions and the spring element is located between the forked portions.

23. The package of claim 1, wherein the insulating material is thermally conductive.

* * * * *